United States Patent Office 2,937,323

Patented May 17, 1960

2,937,323

FUSED JUNCTIONS IN SILICON CARBIDE

Leonard J. Kroko, Pitcairn, and Hung Chi Chang, Pittsburgh, Pa., assignors to Westinghouse Electric Corporation, East Pittsburgh, Pa., a corporation of Pennsylvania No Drawing. Application May 29, 1958
Serial No. 738,631

8 Claims. (Cl. 317—234)

This invention relates to the production of components useful in semiconductor applications such, for example, as in rectifiers.

A material that can be used in semiconductor applications at high temperatures, i.e. above about 500° C., is the silicon carbide single crystal. As with other semiconductor wafers or single crystals, a major problem in the utilization of this material is that of producing rectifying contacts on the silicon carbide crystal.

It is a major object of the present invention to provide novel semiconductor components for use in, for example, rectifying semiconductors.

It is a further object of this invention to provide a component including a silicon carbide single crystal and a fused junction thereon.

Another object is to provide methods for carrying out the foregoing objects that are simple and easily practiced.

As used herein, the term "fused junction," is used to connote a rectifying barrier produced by the fusion to the surface of a single conductivity type semiconductor single crystal a quantity of opposite conductivity type doping impurity.

As a consequence of a fusion of such a doping material to a semiconductor crystal of opposite conductivity, there is produced a p-n or n-n* junction depending, of course, on the nature of the activator impurity and of the conductivity type of semiconductor crystal used. This occurs since upon fusing the conductivity impurity to the surface of the crystal some of the conductivity impurity diffuses into, or is dissolved by, the surface of the crystal thereby creating an impurity rich alloy melt. Upon freezing, semiconductor material crystallizes out of the melt to form a p-n or n-p junction at the interface between the semiconductor material and the recrystallized opposite conductivity type semiconductor.

In accordance with this invention, a fused junction in a p-type silicon carbide single crystal is produced with iron as the doping agent. A quantity of iron, either pure or in an alloy such as silicon-iron or the like, is melted on the surface of the silicon carbide crystal and forms a liquid alloy of silicon carbide and iron. When using alloys, any composition that will provide sufficient iron is used, such as a 50:50 silicon-iron. Upon freezing, an interface or thin layer of silicon carbide rich in iron forms between the bulk of the silicon carbide crystal and the bulk of the iron. In that manner a fused p-n junction-containing crystal can be produced. While the production of fused junctions in silicon carbide is by itself advantageous, it is particularly surprising that this could be accomplished with iron, which is not known as a useful doping agent.

In practicing the invention, iron is melted on the surface of a p-type silicon carbide crystal and held at an elevated temperature to permit alloying in the melt to occur. This temperature generally is about 1400° C. to 1800° C. Thereafter, the unit is permitted to cool slowly to solidify the melt, but is cooled rapidly enough to avoid vaporization of all the iron.

Where excess iron is used, subsequent solidification of the iron can cause the crystal to fracture due to the different expansion and contraction rates of the materials. This situation can be avoided by adding, to the iron, a material that will modify the iron to give an expansion rate comparable to that of the crystal. Another method of avoiding this undesirable result involves removing excess iron prior to solidification. This can be accomplished conveniently simply by raising the specimen temperature sufficiently high, e.g. 1900° C. to 2050° C., for a period on the order of about ½ to 2 minutes that is just sufficient to drive off excess iron and then cooling to solidify the junction.

When the iron melts, it diffuses into, or is dissolved by, the surface of the crystal thereby creating an impurity rich melt. Consequently, a silicon carbide vapor is produced and may decompose into elemental silicon and carbon. When this occurs, free carbon can deposit in the melt and detract from the efficiency of the device, and perhaps totally destroy its usefulness.

The foregoing is avoided, in accordance with this invention, by providing silicon at the initiation of the process in an amount sufficient to overcome the loss due to decomposed silicon carbide vapor. Silicon can be introduced into the system by providing an adequate partial pressure of silicon during the fusion process, or by using the iron in admixture with sufficient silicon to replace that lost through decomposition of the silicon carbide and to provide a suitable partial pressure of silicon. Suitably, an argon or other inert gas atmosphere is maintained during this embodiment of the process.

While excess iron can be readily removed as described above, it is preferred that a minimum be used. Satisfactory results have been achieved upon using an amount of iron sufficient to provide an even layer about 0.001 inch thick over the surface of the crystal. As is apparent, the quantity of iron used will vary according to the size of the surface of the crystal in which a fused junction is to be produced. Although the iron generally is used in wire form, powder or discs are equally useful. In all instances care is taken to be sure that contact is made with the entire surface of the crystal, as by pressing a thin disc of iron against it. The iron used, either as iron or as an alloy of iron, should be of the highest purity available, exclusive of intentional alloying constituents, and contain no more than about one percent total impurities and not more than about 0.1 percent by weight of aluminum or boron. Electrolytic flake iron generally conforms to the requirements. Where feasible, the iron is cleaned with carbon tetrachloride or similar agents before use.

P-type silicon carbide crystals for use in this invention can be prepared in any manner desired. One method that may be used is disclosed in our copending application Serial No. 738,806, filed May 29, 1958. P-type crystals are obtained by that method when a p-type impurity from group III of the periodic table, such, for example, as aluminum, is present in the argon gas used during crystal growth. The crystals normally are prepared for the fusion process by lapping the surface to be treated and then cleaning, as by immersion in carbon tetrachloride followed by hydrofluoric acid, to remove all surface contaminants. Other cleaning methods such as high temperature etching or the like also can be used.

The invention will be described further in conjunction with the following example in which the details are given by way of illustration and are not to be construed as limiting the invention.

A p-type silicon carbide single crystal obtained by nucleation and growth from silicon carbide vapor in an aluminum-containing argon atmosphere was used. The crystal was cut to dimensions of about ⅛ inch in diameter and to a thickness within the range of 0.010 to 0.030 inch. The crystal was inspected to choose a side for preparing a junction. The side was lapped with diamond powder until visual inspection showed the surface to be roughened in an apparently symmetrical pattern.

The crystal was immersed in carbon tetrachloride to remove the lapping compound vehicle, and then placed in dilute hydrofluoric acid for five minutes to remove other contaminants. The prepared crystal was laid in a graphite boat with the roughened side uppermost. A one-mil thick iron wire, previously cleaned in carbon tetrachloride, was laid on the crystal surface. The boat, with the prepared crystal was placed in an A.-C. resistance heated vacuum furnace.

The pressure was lowered to about $10^{-4}$ mm. of mercury and then the furnace temperature was raised to 1600° C. This temperature was maintained for ½ hour. At the end of this period, the temperature was raised to 2000° C. for one minute to evaporate excess iron and then was permitted to cool slowly. Examination of the resulting crystal disclosed that a p-n junction had formed.

Where it is desired to provide a vapor of silicon to avoid silicon carbide decomposition, the procedure of the foregoing example is modified as follows: A small piece of silicon is placed in the furnace along with the loaded boat. After the vacuum has been drawn to remove impurities, the furnace is pressured with argon. Upon heating, the silicon vaporizes thereby suppressing decomposition of the silicon carbide.

The crystals containing p-n junctions prepared as just described can be used in place of grown junction crystals in various applications, e.g. in semiconductor rectifiers. Tests on the junctions obtained show that they have all the observable characteristics of grown junctions. Moreover, p-n and n-n* junctions are useful in that they exhibit electro-luminescence.

One particular advantage of junction-containing crystals prepared in accordance with this invention is the fact that ohmic contacts can be made to the fused area readily. The usual material used for this purpose is molybdenum, suitably nickel-clad molybdenum. If desired, tantalum, nickel, silicon or tungsten also can be used for this purpose.

In accordance with the provisions of the patent statute, the principle of this invention has been explained and there has been described what is now believed to represent its best embodiment. However, it is to be understood that the invention may be practiced otherwise than as specifically described.

We claim as our invention:

1. A silicon carbide single crystal having on one surface thereof a fused junction layer including iron as the significant conductivity impurity.

2. A silicon carbide single crystal having on one surface thereof a fused junction layer including iron as the significant n-type conductivity impurity, and an ohmic contact to said fused layer made with a member selected from the group consisting of molybdenum, tantalum, tungsten, nickel and silicon.

3. A method of providing a fused junction in p-type silicon carbide single crystals comprising melting iron on the surface of a p-type silicon carbide single crystal, and then permitting the resulting crystal to cool.

4. A process according to claim 3 wherein the crystal is maintained at a temperature of above 1400° C. for about 15 minutes to one hour.

5. A method of providing a fused junction in p-type silicon carbide single crystals comprising melting iron on the surface of a p-type silicon carbide single crystal at a temperature of about 1400° C. to 1800° C., then raising the crystal temperature to about 1950° C. to 2050° C. to evaporate excess iron, and then permitting the resulting crystal to cool to solidify the junction produced.

6. A method comprising subjecting a p-type silicon carbide single crystal having a layer of iron on one surface thereof to a temperature of at least about 1400° C. in the presence of a partial pressure of silicon sufficient to substantially prevent decomposition of silicon carbide vapor, and then cooling the resultant structure.

7. A semiconductor device comprising a single crystal of silicon carbide having p-type conductivity within a portion thereof, and a surface area of the silicon carbide crystal adjacent to and in contact with the p-type portion being doped with iron to provide n-type conductivity at the said surface area whereby to provide a p-n junction.

8. A semiconductor device comprising a single crystal of silicon carbide having p-type conductivity within a portion thereof, a surface area of the silicon carbide crystal adjacent to and in contact with the p-type portion being doped with iron to provide n-type conductivity at the said surface area whereby to provide a p-n junction, and an ohmic contact with the iron doped n-type surface area comprising a member selected from the group consisting of molybdenum, tantalum, tungsten, nickel and silicon.

References Cited in the file of this patent

UNITED STATES PATENTS 2,831,787 Emeis ------------------ Apr. 22, 1958